United States Patent [19]

Takase

[11] Patent Number: 4,611,172

[45] Date of Patent: Sep. 9, 1986

[54] RECEPTION SIGNAL PROCESSING APPARATUS IN NUCLEAR MAGNETIC RESONANCE DIAGNOSTIC APPARATUS

[75] Inventor: Hidetomo Takase, Yaita, Japan

[73] Assignee: Tokyo Shibaura Denki Kabushiki Kaisha, Kawasaki, Japan

[21] Appl. No.: 527,565

[22] Filed: Aug. 29, 1983

[30] Foreign Application Priority Data

Aug. 28, 1982 [JP] Japan ................. 57-149773

[51] Int. Cl.$^4$ ........................... G01R 33/08
[52] U.S. Cl. ........................ 324/314; 324/309
[58] Field of Search ............ 324/307, 309, 83 D, 324/77 B, 313, 311, 314; 323/212, 215

[56] References Cited

U.S. PATENT DOCUMENTS

| | | | |
|---|---|---|---|
| 2,758,219 | 8/1956 | Miller | 323/215 |
| 3,634,760 | 1/1972 | Murtin | 324/77 R |
| 4,171,511 | 10/1979 | Hill | 324/313 |
| 4,315,216 | 2/1982 | Clow et al. | 324/309 |
| 4,418,316 | 11/1983 | Young | 324/309 |
| 4,471,305 | 9/1984 | Crooks | 324/309 |

FOREIGN PATENT DOCUMENTS

| | | | |
|---|---|---|---|
| 2037999 | 7/1980 | United Kingdom | 324/309 |
| 2076540 | 12/1981 | United Kingdom | 324/309 |

OTHER PUBLICATIONS

Lai et al., "Automatic Correction of Nuclear Magnetic Resonance Zeugmatographic Projections," J. Phys. E: Sci. Instrum, vol. 14, 1981.

Neff et al., "Fully Automatic Software Correction of Fourier Transform NMR Spectra," Journal of Magnetic Resonance, 25, 335-340 (1977).

Primary Examiner—Reinhard J. Eisenzopf
Assistant Examiner—G. Peterkin
Attorney, Agent, or Firm—Finnegan, Henderson, Farabow, Garrett & Dunner

[57] ABSTRACT

Reception signal processing apparatus in nuclear magnetic resonance diagnostic apparatus to display as an image the distribution of the spin density or relaxation time of specified atomic nuclei existing in an object utilizing nuclear magnetic resonance phenomena including a phase demodulator for phase demodulating a nuclear magnetic resonance signal evoked by nuclear magnetic resonance phenomena in accordance with two reference waves whose phases are different from one another by 90°, an analog-to-digital converter for digitalizing the separated two signals obtained by the phase demodulator, and a phase correction processor for automatically correcting the phase difference between the reference waves and nuclear magnetic resonance signal to produce a frequency spectrum by processing the digitalized signals.

5 Claims, 9 Drawing Figures

RECEPTION SIGNAL PROCESSING APPARATUS IN NUCLEAR MAGNETIC RESONANCE DIAGNOSTIC APPARATUS

FIELD OF THE INVENTION

This invention relates to nuclear magnetic resonance diagnostic apparatus to display as an image the distribution of the spin density or relaxation time of specified atomic nuclei existing in an object utilizing nuclear magnetic resonance (NMR) phenomena, and more particularly to reception signal processing apparatus to process the received NMR signals at the preliminary stage of image formation.

BACKGROUND OF THE INVENTION

Nuclear magnetic resonance diagnostic apparatus developed recently are constructed to phase-demodulate the detected NMR signals with two reference waves having a 90° phase difference. The frequency and phase information of the resultant demodulated signals are used for image reconstruction.

Two kinds of NMR signals F'c(t) and F's(t) obtained by demodulation have relationships, which are represented by the first and second formulas, respectively, with the frequency spectrum p(ω) which reflects the spin density or relaxation time of the atomic nuclei.

$$Fc'(t) = \int_{-\infty}^{\infty} p(\omega)\cos(\omega t + \Delta\theta)d\omega \quad (1)$$

$$Fs'(t) = \int_{-\infty}^{\infty} p(\omega)\sin(\omega t + \Delta\theta)d\omega \quad (2)$$

where
p(ω) is the frequency spectrum of a reception signal (which corresponds to the spin density and relaxation time of an atomic nucleus);
ω is angular frequency;
t is time; and
Δθ is the phase difference between a reference wave and reception signal at a demodulation time.

However, if the two signals of the formulas above are Fourier transformed, p(ω) appears as is shown in FIG. 1(d) if Fc'(t) and Fs'(t) are as shown in FIGS. 1(b) and (c). It is impossible to obtain p(ω) as shown in FIG. 1(a) which is necessary to form an image, since the phase difference Δθ exists in the first and second formulas, indicating that the phases of the reference waves and the NMR signal are not necessarily in coincidence at the demodulation time.

Consequently, in the conventional NMR apparatus, its operator has to manually adjust the phase relation between the reference wave and the NMR signal at the demodulation time to be coincident with each other, while observing the frequency spectrum after Fourier transformation. However, with such a manual adjustment, individual differences appear in the result and it takes an extremely long time for the adjustment.

SUMMARY OF THE INVENTION

It is therefore an object of this invention to provide reception signal processing apparatus in nuclear magnetic resonance (NMR) diagnostic apparatus to correct automatically the influence due to the phase difference between the reference waves and the NMR signal when phase demodulating an NMR signal in accordance with two reference waves which have the same resonance frequency as the resonance signal and are different from one another by a 90° phase shift.

Briefly, this and other objects are achieved in accordance with a first aspect of the invention by reception signal processing apparatus in NMR diagnostic apparatus to display as an image the distribution of the spin density or relaxation time of specified atomic nuclei existing in an object utilizing NMR phenomena comprising means for phase demodulating an NMR signal evoked by NMR phenomena in accordance with two reference waves for which the phases of their resonance frequency are different from one another by 90°, means for digitalizing the separated two signals obtained by the phase demodulating means, and phase correction processing means which operate as described below to automatically correct the phase difference between the reference waves and the NMR signal.

DESCRIPTION OF THE PREFERRED EMBODIMENT

Figure 1:
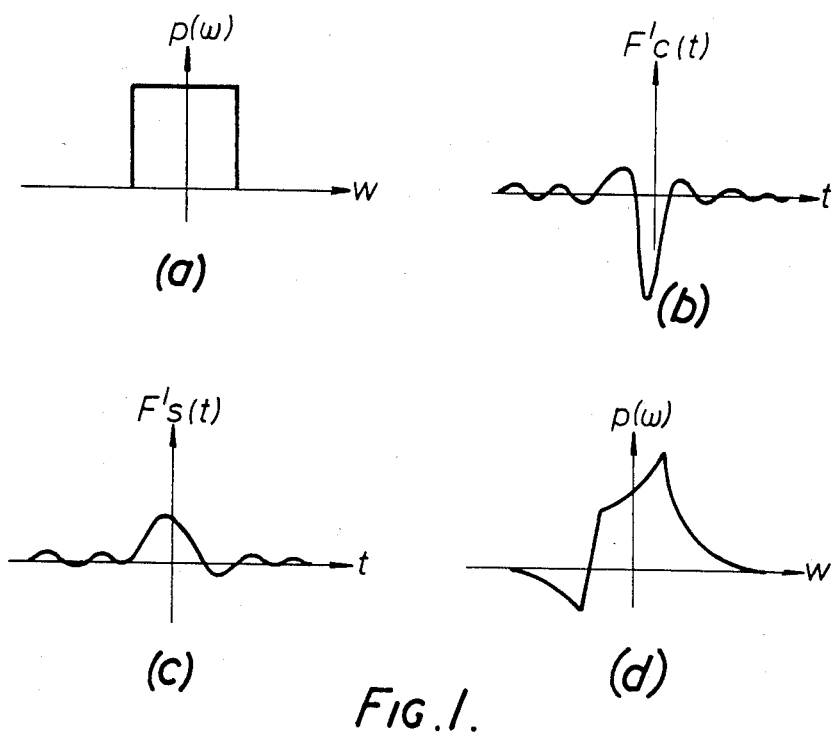
FIG. 1(a) is a wave form chart illustrating the frequency spectrum of an NMR signal.
FIGS. 1(b) and (c) are wave form charts illustrating two kinds of frequency spectra as observed at the times when the reference wave and NMR signal are different in phase from each other at the demodulation time.
FIG. 1(d) is a wave form chart illustrating the frequency spectrum obtained by Fourier transformation of the two kinds of NMR signals.

NMR signals observed in fact are represented by the first and second formulas as described above. Developing the first and second formulas, they are as follows:

$$Fc'(t) = \int_{-\infty}^{\infty} p(\omega)(\cos\omega t\cos\Delta\theta - \sin\omega t\sin\Delta\theta)d\omega \quad (1')$$

$$= \cos\Delta\theta Fc(t) - \sin\Delta\theta Fs(t)$$

$$Fs'(t) = \int_{-\infty}^{\infty} p(\omega)(\sin\omega t\cos\Delta\theta + \cos\omega t\sin\Delta\theta)d\omega \quad (2')$$

$$= \cos\Delta\theta Fs(t) + \sin\Delta\theta Fc(t)$$

Here, $$Fc(t) = \int_{-\infty}^{\infty} p(\omega)\cos\omega t d\omega \quad (3)$$

$$Fs(t) = \int_{-\infty}^{\infty} p(\omega)\sin\omega t d\omega \quad (4)$$

In order to reduce the distortion of the frequency spectrum p(ω) due to the phase difference Δθ between the NMR signal and the difference wave, the value of phase reference Δθ must be known.

There are two kinds of methods for finding the value of the phase difference.

In accordance with the first method, $F'c(t)^2 + F's(t)^2$ represents a value which is proportional to the magnitude of magnetization which induces an NMR signal. Here, the following formulas (5) and (6) are obtained from the formulas (1') and (2'), respectively:

$$Fc'(t)^2 = \cos^2\Delta\theta Fc(t)^2 + \sin^2\Delta\theta Fs(t)^2 - 2\cos\Delta\theta\sin\Delta\theta Fc(t)Fs(t) \quad (5)$$

$$Fs'(t)^2 = \cos^2\Delta\theta Fs(t)^2 + \sin^2\Delta\theta Fc(t)^2 + 2\cos\Delta\theta\sin\Delta\theta Fc(t)Fs(t) \quad (6)$$

Therefore, $$Fc'(t)^2 + Fs'(t)^2 = (\cos^2\Delta\theta + \sin^2\Delta\theta)Fc(t)^2 + (\cos^2\Delta\theta + \sin^2\Delta\theta)Fs(t)^2 \quad (7)$$

$$= Fc(t)^2 + Fs(t)^2$$

Accordingly, $Fc'(t)^2 + Fs'(t)^2$ and $Fc(t)^2 + Fs(t)^2$ are equivalent.

At time $t = 0$ the formulas (3) and (4) are:

$$Fc(0) = \int_{-\infty}^{\infty} p(\omega)d\omega \quad (8)$$

$$Fs(0) = 0 \quad (9)$$

Therefore, $$Fc(0)^2 + Fs(0)^2 = \left[\int_{-\infty}^{\infty} p(\omega)d\omega\right]^2 \quad (10)$$

Consequently, $Fc(t)^2 + Fs(t)^2$ and $Fc'(t)^2 + Fs'(t)^2$ are maximum at $t = 0$. $Fc'(t)$ and $Fs'(t)$ at that time are respectively:

$$Fc'(0) = \cos\Delta\theta \int_{-\infty}^{\infty} p(\omega)d\omega \quad (11)$$

$$Fs'(0) = \sin\Delta\theta \int_{-\infty}^{\infty} p(\omega)d\omega \quad (12)$$

also, $$\int_{-\infty}^{\infty} p(\omega)d\omega \alpha \text{ the magnitude of magnetization} \quad (13)$$

Figure 2:
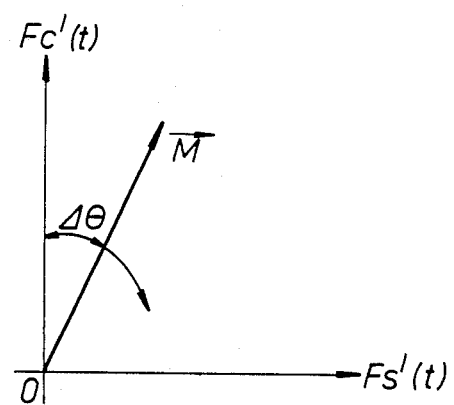
FIG. 2 is a graphical representation illustrating a relationship between the magnetization vector and the two kinds of NMR signals.

There is diagramatically illustrated in FIG. 2 the relationship among the above formulas (11), (12) and (13).

Consequently, the phase difference $\Delta\theta$ can be found in accordance with the following formula (14) on the basis of $Fc'(t)$ and $Fs'(t)$:

$$\Delta\theta = \tan^{-1}\left[\frac{Fs'(tmax)}{Fc'(tmax)}\right] \quad (14)$$

where
t max is the time when $Fc'(t)^2 + Fs'(t)^2$ is maximum, namely when $t = 0$.

In accordance with the second method resolving the aforementioned formulas (1') and (2') for $Fc(t)$ and $Fs(t)$:

$$Fc(t) = \cos\Delta\theta Fc'(t) + \sin\Delta\theta Fs'(t) \quad (15)$$

$$Fs(t) = -\sin\Delta\theta Fc'(t) + \cos\Delta\theta Fs'(t) \quad (16)$$

Representing $Fc(t)$ and $Fs(t)$ in imaginary space coordinates, namely in a complex signal description, they are:

$$Fc(t) + jFs(t) = [Fc'(t) + jFs'(t)]\exp(-j\Delta\theta) \quad (17)$$

where j is an imaginary number unit. Here, if assuming $F(t) = Fc(t) + jFs(t)$ and $F'(t) = Fc'(t) + jFs'(t)$, the formula (17) is:

$$F(t) = F'(t)\exp(-j\Delta\theta) \quad (18)$$

By Fourier-transforming the formula (18), the frequency spectrum $p(\omega)$ is represented as follows:

$$p(\omega) = \int_{-\infty}^{\infty} F(t)\exp(-j\omega t)d\omega \quad (19)$$

$$= \exp(-j\Delta\theta)\int_{-\infty}^{\infty} F'(t)\exp(-j\omega t)d\omega$$

$$= \exp(-j\Delta\theta)[Pi'(\omega) + jPj'(\omega)]$$

where $Pr'(\omega)$ and $Pj'(\omega)$ represent a real part and imaginary part of the complex Fourier-transformation.

Also, transforming the formula (19), the following formula is obtained:

$$p(\omega) = \exp(-j\Delta\theta)[Pr'(\omega) + jPi'(\omega)] \quad (20)$$

$$= Pr'(\omega)\cos\Delta\theta + Pi'(\omega)\sin\Delta\theta + j[-Pr'(\omega)\sin\Delta\theta + Pi'(\omega)\cos\Delta\theta]$$

Since $P(\omega)$ is a real function, the imaginary part in the formula (20) comes to zero. Accordingly, it is possible to find $\Delta\theta$ utilizing $-pr'(\omega)\sin\Delta\theta + Pj'(\omega)\cos\Delta\theta = 0$.

By using $\Delta\theta$ found by one of the above methods, the frequency spectrum may be obtained by correcting the phase difference by the following three methods.

No. 1

First, $Fc(t)$ and $Fs(t)$ are found on the basis of using formula (14) to determine $\Delta\theta$ and using the observed signals $Fc'(t)$ and $Fs'(t)$, and then applying these in accordance with the formulas (15) and (16). Next, the frequency spectrum is found by Fourier-transforming that $Fc(t)$ and $Fs(t)$.

No. 2

The observed signals $Fc'(t)$ and $Fs'(t)$ are Fourier transformed after transformation into complex space coordinate system. And the frequency spectrum is found by substituting $\Delta\theta$ which is found with formula (14) into the real part of the formula (20).

No. 3

The observed signals $Fc'(t)$ and $Fs'(t)$ are Fourier transformed after transformation into complex space coordinate system. And the frequency spectrum is found by substituting $\Delta\theta$ which is found with the imaginary part of formula (20) into the real part thereof.

One embodiment of the invention in which the aforementioned principle is embodied will now be explained referring to the figures.

Figure 3:
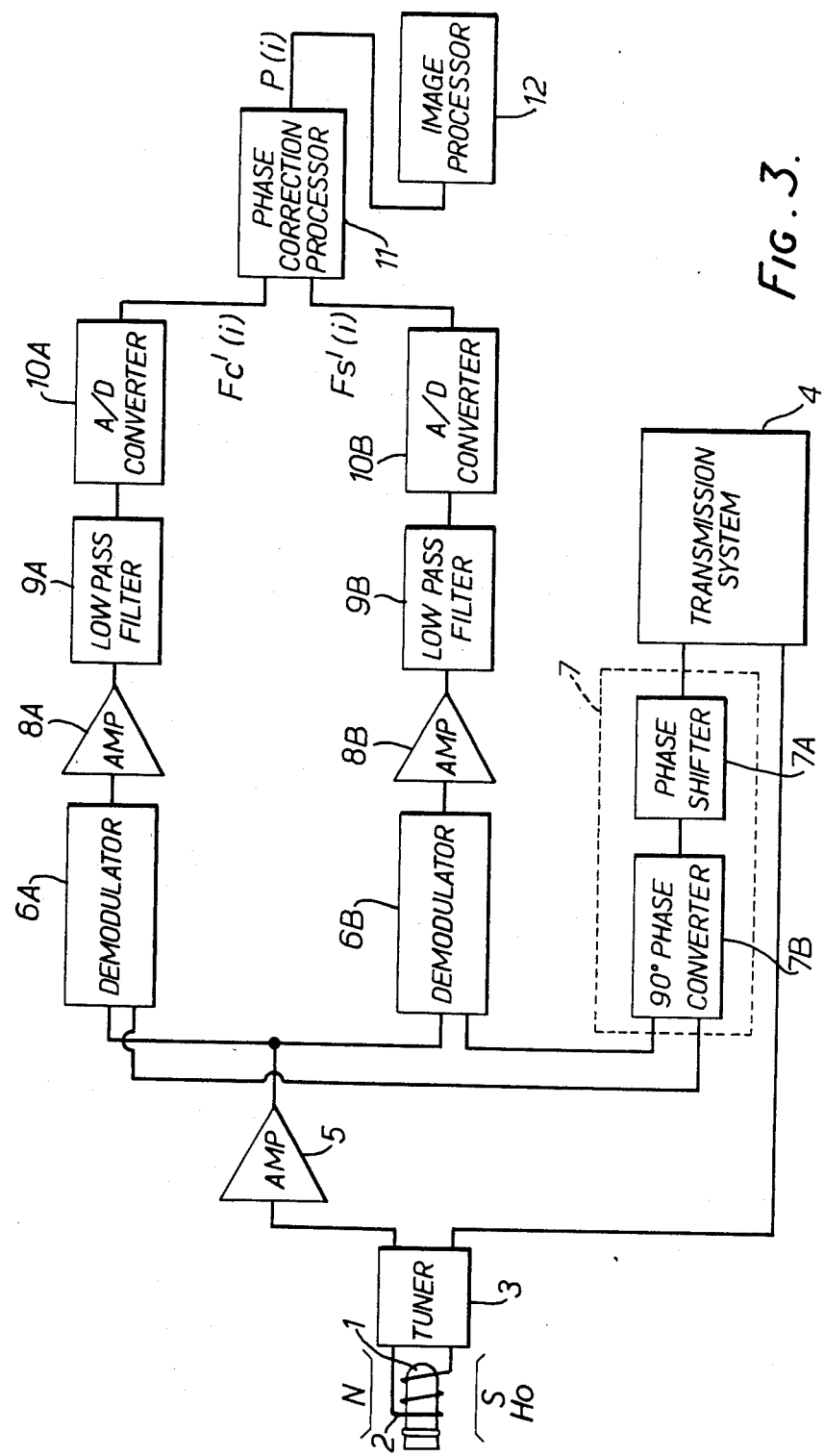
FIG. 3 is a schematic block diagram illustrating the construction of an embodiment of this invention.

In FIG. 3, an object 1 is placed in the static magnetic field Ho and also in the field of a transmission and reception signal coil 2 which generates a magnetic field perpendicular to the static magnetic field Ho. A tuner 3 operates to select an electromagnetic wave of specified frequency from the electromagnetic signal issued from transmission system 4, to be applied as an excitation pulse to coil 2, the frequency being the resonant frequency of the specified atomic nucleus such as hydrogen within the object 1. Amplifier 5 amplifies the NMR signal received by the coil 2 to deliver it to two phase demodulators 6A and 6B. A reference signal generator 7 being provided with a phase shifter 7A and a 90° phase converter 7B, generates two kinds of reference waves, each having the same frequency as the NMR signal but with phases differing from each other by 90°. The generated reference waves are supplied to the phase demodulators 6A and 6B, respectively.

The two phase demodulators 6A and 6B phase demodulate the NMR signal with the reference wave to separately generate two analog signals Fc'(t) and Fs'(t), respectively. The separated signals Fc'(t) and Fs'(t) are amplified by amplifiers 8A and 8B, the high frequency component of the signals are blocked by low pass filters 9A and 9B and the signals are digitalized by analog-to-digital (A/D) converters 10A and 10B, respectively. These digitalized signals Fc'(i) and Fs'(i) are applied to a phase correction processor 11.

This phase correction processor 11 is a digital calculation apparatus for finding the phase difference between the reference wave and NMR signal to produce the frequency spectrum without influence due to the phase difference. That is, the phase correction processor 11 performs a calculation in compliance with one of the routines as shown in FIGS. 4 to 6 for phase correction in accordance with one of the above described three methods, thereby producing projection data P(i) to an image processor 12.

Figure 4:
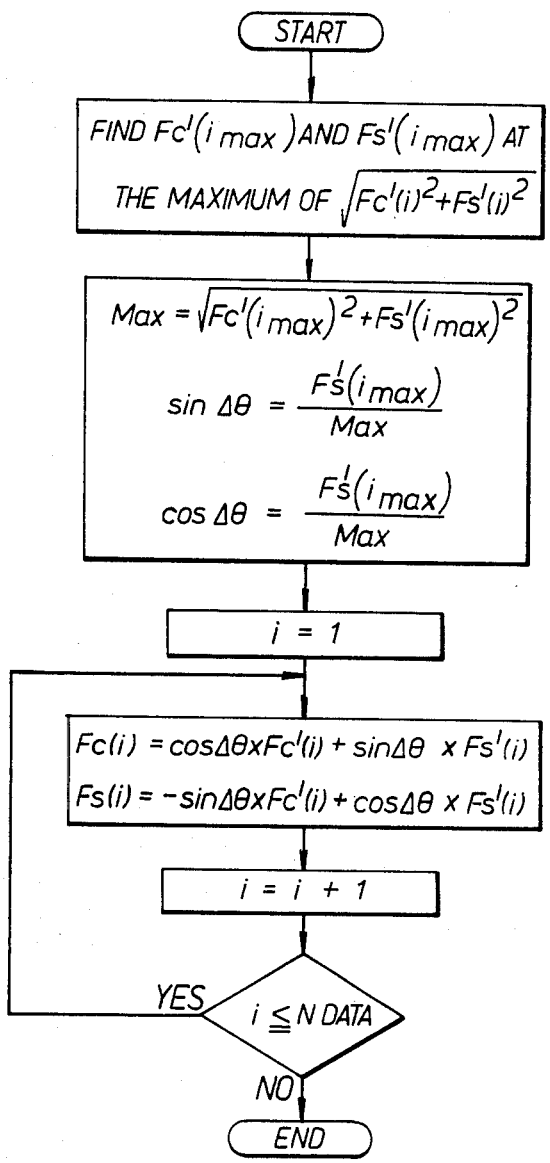
FIGS. 4 to 6 are flow charts illustrating the different methods of phase correction according to the invention.

Referring first to the routine of FIG. 4, Fc'(i max) and Fs'(i max), at the time when Fc'(i)²+Fs'(i)² assumes the maximum value Max are found and inputted to the phase correction processor 11. Next, sin $\Delta\theta$ is calculated based on values of Fs'(i max) and Max while cos $\Delta\theta$ is calculated based on values of Fc'(i max) and Max. Fc(i) and Fs(i) are found based on values of cos $\Delta\theta$, sin $\Delta\theta$, Fc'(i) and Fs'(i) in accordance with the formulas (15) and (16).

NFFT is the number of times Fourier transformation is undertaken, N being the number of calculations. It is thereby possible to obtain the data of Fc(1), Fc(2), . . . , Fc(N), and Fs(1), Fs(2), . . . Fs(N). Fc(i) and Fs(i) are transformed to the frequency spectrum p(i) which is not influenced by $\Delta\theta$ after Fourier transformation. The routine shown in FIG. 4 corresponds to the No. 1 method which has been described above.

Figure 5:
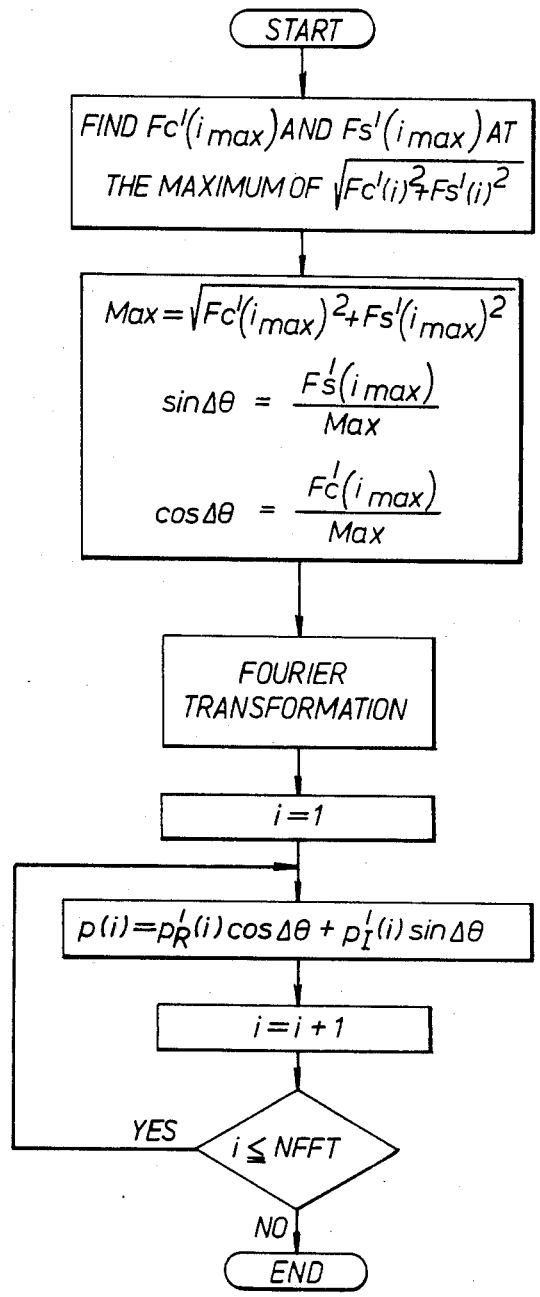
Figure 6:
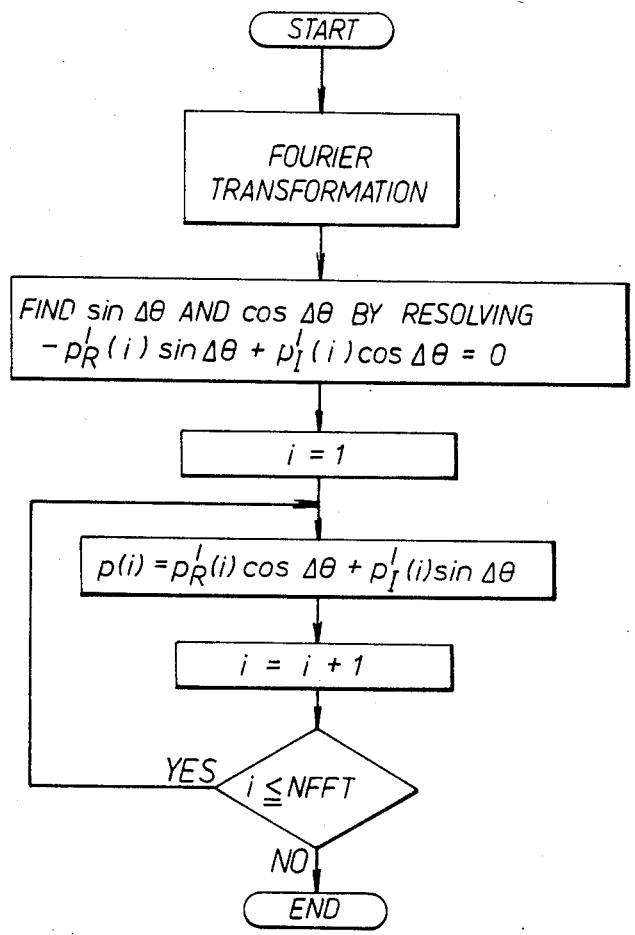

The routine of FIG. 5 corresponds to the No. 2 method above. That is, sin $\Delta\theta$ and cos $\Delta\theta$ are found based on values of Fc'(i) and Fs'(i) which are inputted to the phase correction processor 11, in a routine similar to that of FIG. 4. Next, Fc'(i) and Fs'(i) are Fourier transformed after conversion to complex space coordinate system, P(i) is found in accordance with the real part of formula (20) based on the obtained values of Pr'(i), Pi'(i), cos $\Delta\theta$ and sin $\Delta\theta$. NDATA is the number of times Fourier transformation is undertaken, and if there are N calculations, it is possible to obtain p(1), p(2), . . . p(N) as the frequency spectrum.

The routine of FIG. 6 corresponds to the No. 3 method described above. Fc'(i) and Fs'(i) are Fourier transformed in compliance with formulas (18) and (19) after conversion to complex space coordinate system. Sin $\Delta\theta$ and cos $\Delta\theta$ next are found by putting the imaginary part of the formula (20) to zero. p(i) is found in accordance with the real part of the formula (20) based on values of Pr'(i) and Pi'(i) as obtained by Fourier transformation and the obtained values of sin $\Delta\theta$ and cos $\Delta\theta$.

The two signals are phase corrected by any one of the above described routines and are delivered to an image processing apparatus 12 to perform the imaging procedure as to spin density and relaxation time of the specified atomic nucleus such as hydrogen.

According to the construction as described above in detail, it is possible to automatically correct the influence due to the phase difference between the reference wave and NMR signal, to obtain an accurate frequency spectrum which is produced by demodulating the NMR signal with two reference waves differing from each other by 90° in phase and Fourier transforming the digitalized two signals Fc'(i) and Fs'(i) or two signals Fc(i) and Fs(i).

It will be apparent, to those skilled in the art, that modifications and variations can be made in the preferred embodiment disclosed herein without departing from the scope or the spirit of the invention.

What is claimed is:

1. A reception signal processing method for use in a nuclear magnetic resonance diagnostic apparatus to display as an image the distribution of the spin density or relaxation time of specified atomic nuclei existing in an object utilizing the magnetic resonance phenomena and resultant nuclear magnetic resonance signal, the reception signal processing method comprising the steps of:

demodulating a nuclear magnetic resonance signal using two reference waves, the phases of which are different from one another by 90°, to produce two demodulated nuclear magnetic resonance signals Fc'(t) and Fs'(t);

digitalizing said two demodulated signals obtained by said step of demodulating to produce two digitized signals Fc'(i) and Fs'(i);

summing Fs'(i)² and Fc'(i)² at discrete time intervals i and determining for what value of i = "i max" the term "Max" is at a maximum value, where $$Max = \sqrt{Fs'(imax)^2 + Fc'(imax)^2} \ ;$$

finding the phase difference $\Delta\theta$ between the reference waves and nuclear magnetic resonance signal by using one of the relationships:

$$\Delta\theta = \sin^{-1}\left(\frac{Fs'(imax)}{Max}\right) ;$$

$$\Delta\theta = \cos^{-1}\left(\frac{Fc'(imax)}{Max}\right) ;$$

$$\Delta\theta = \tan^{-1}\left(\frac{Fs'(imax)}{Fc'(imax)}\right) ;$$

phase correcting said digitalized signals Fc'(i) and Fs'(i) using $\Delta\theta$ to thereby obtain Fc(i) and Fs(i); and employing Fc(i) and Fs(i) to display as an image the distribution of the spin density or relaxation time of said specified atomic nuclei.

2. A method of claim 1 wherein during said step of phase correcting, Fc(i) and Fs(i) are obtained using the relationships:

$$Fc(i) = Fc'(i) \cdot \cos \Delta\theta + Fs'(i) \cdot \sin \Delta\theta;$$

and $$Fs(i) = Fs'(i) \cdot \cos \Delta\theta - Fc'(i) \cdot \sin \Delta\theta.$$

3. A reception signal processing apparatus for use in a nuclear magnetic resonance diagnostic apparatus to display as an image the distribution of the spin density or relaxation time of specified atomic nuclei existing in an object utilizing the magnetic resonance phenomena and resultant nuclear magnetic resonance signal, the reception signal processing apparatus comprising:

means for phase demodulating a nuclear magnetic resonance signal using two reference waves, the phases of which are different from one another by 90°, to produce two demodulated nuclear magnetic resonance signals Fc'(t) and Fs'(t);

means for digitalizing said two demodulated signals obtained by said phase demodulating means to produce two digitized signals Fc'(i) and Fs'(i);

means for summing Fs'(i)$^2$ and Fc'(i)$^2$ at discrete time intervals i and for determining for what value of i="i max" the term "Max" is at a maximum value where $$Max = \sqrt{Fs'(imax)^2 + Fc'(imax)^2} \; ;$$

means for finding the phase difference $\Delta\theta$ between the reference waves and said nuclear magnetic resonance signal by using one of the relationships:

$$\Delta\theta = \sin^{-1}\left(\frac{Fs'(imax)}{Max}\right) \; ;$$

$$\Delta\theta = \cos^{-1}\left(\frac{Fc'(imax)}{Max}\right) \; ; \text{and}$$

$$\Delta\theta = \tan^{-1}\left(\frac{Fs'(imax)}{Fc'(imax)}\right)$$

means for phase correcting said digitalized signals Fc'(i) and Fs'(i) using $\Delta\theta$ to thereby obtain Fc(i) and Fs(i); and means for employing Fc(i) and Fs(i) to display as an image the distribution of the spin density or relaxation time of said specified atomic nuclei.

4. The reception signal processing apparatus of claim 3 wherein said means for phase correcting includes a digital operation apparatus which performs phase correction on said digitalized demodulation signals using $\Delta\theta$ and then Fourier transforms said signals.

5. An apparatus of claim 3 wherein said means for phase correcting includes means for obtaining Fc(i) and Fs(i) using the relationships:

$$Fc(i) = Fc'(i) \cdot \cos \Delta\theta + Fs'(i) \cdot \sin \Delta\theta;$$

and $$Fs(i) = Fs'(i) \cdot \cos \Delta\theta + Fc'(i) \cdot \sin \Delta\theta.$$

* * * * *